United States Patent [19]

Neisius et al.

[11] Patent Number: 4,786,578

[45] Date of Patent: Nov. 22, 1988

[54] AGENT AND METHOD FOR THE REMOVAL OF PHOTORESIST AND STRIPPER RESIDUES FROM SEMICONDUCTOR SUBSTRATES

[75] Inventors: Karl H. Neisius, Darmstadt; Alois Litters, Lampertheim Hofheim, both of Fed. Rep. of Germany

[73] Assignee: Merck Patent Gesellschaft Mit Beschrankter Haftung, Darmstadt, Fed. Rep. of Germany

[21] Appl. No.: 77,970

[22] Filed: Jul. 20, 1987

Related U.S. Application Data

[63] Continuation of Ser. No. 819,563, Jan. 17, 1986, abandoned.

[30] Foreign Application Priority Data

Jan. 19, 1985 [DE] Fed. Rep. of Germany ....... 3501675

[51] Int. Cl.$^4$ .............................................. G03C 11/12
[52] U.S. Cl. ..................................... 430/256; 430/326; 430/329; 430/331; 134/38; 252/8; 252/14
[58] Field of Search ............... 430/326, 329, 331, 256, 430/259, 9, 311; 252/174.21, 548, DIG. 1, DIG. 8, DIG. 14; 134/38

[56] References Cited

U.S. PATENT DOCUMENTS

| 2,914,482 | 11/1959 | Kopp . | |
|---|---|---|---|
| 3,663,445 | 5/1972 | Augustin et al. . | |
| 3,870,647 | 3/1975 | Travers | 252/118 |
| 3,983,078 | 9/1976 | Collins | 252/540 |
| 4,202,703 | 5/1980 | Zuber et al. . | |
| 4,202,800 | 5/1980 | Ciko et al. | 252/543 |
| 4,592,787 | 6/1986 | Johnson | 134/38 |

FOREIGN PATENT DOCUMENTS

| 0120528 | 2/1984 | European Pat. Off. . |
| 1573208 | 8/1976 | United Kingdom . |
| 2068405 | 1/1981 | United Kingdom . |

OTHER PUBLICATIONS

"Photoresist Materials and Processes", S. DeForest, 1975, McGraw Hill Book Co.
Patents Abstract of Japan, vol. 8, No. 208, P-302, 1645, Sep. 1984.

Primary Examiner—José G. Dees
Attorney, Agent, or Firm—Millen & White

[57] ABSTRACT

Photoresist and stripper residues can be rapidly and completely removed from semiconductor substrates after the stripping process with an aqueous post-rinsing agent which contains a nonionogenic surfactant and an organic base.

18 Claims, No Drawings

AGENT AND METHOD FOR THE REMOVAL OF PHOTORESIST AND STRIPPER RESIDUES FROM SEMICONDUCTOR SUBSTRATES

This application is a continuation of application Ser. No. 819,563, field Jan. 17, 1986, abandoned.

BACKGROUND OF THE INVENTION

The invention relates to a new agent and consequently a better method for the removal of photoresist and stripper residues from semiconductor substrates.

At the present time the manufacture of semiconductor components and integrated circuits is carried out virtually exclusively using photolithographic processes. For the purposes of patterning, the semiconductor substrates are coated with photoresists (positive or negative photoresists) and photoresist relief patterns are generated on them by imagewise exposure and subsequent development. These patterns then act as a mask for the actual patterning processes such as etching, doping, coating with metals, other semiconductor materials or also insulating materials. After these processes, the photoresist masks have to be removed again. For this purpose special stripping agents known as strippers in the relevant linguistic usage are used. These are normally mixtures of organic solvents which contain in addition surface-active substances, in general mixtures of alkylbenzenesulphonic acids.

To remove the photoresist coatings, the semiconductor materials (generally these are silicon discs, so-called wafers) are immersed in a stripper bath of this type which, to increase its effectiveness, is normally heated to temperatures between 80° and 150° C., usually around 100° C. When this is done, the photoresist is stripped off after a more or less short time.

After the stripping off of the resist, it is necessary for still-adhering residues of stripper as well as any incompletely removed photoresist residues or degradation products thereof to be removed from the semiconductor materials in order to obtain a completely clean surface which meets the high purity requirements of semiconductor technology. This can be done, for example, in one or more intermediate baths, for example in organic solvents such as acetone, alcohols or xylene and in a subsequent post-rinse with de-ionized water.

Simply for reasons of process simplification and of making savings, but also for reasons of safety at the place of work and protection of the environment, attempts are being made to avoid the intermediate bath step using organic solvents.

Accordingly it has become the practice to rinse off the semiconductor substrate directly with water immediately after removal from the stripper bath. However, if a water encumbered with stripper residues is not first immersed in an organic solvent after the stripping process but directly into a stationary water bath, then a deposit is formed as a result of alkylbenzenesulphonic acid precipitating. The latter can be removed with water and this takes place the more rapidly, the more vigorous the motion of the water bath. More beneficial is rinsing off under running water, in which case the latter should if possible be under slight pressure. The rinsing off of stripper residues with water immediately after the stripping process assumes, however, that the photoresist has been completely stripped off during stripping and that the wafer is only encumbered with stripper residues after removal from the bath but not with photoresist residues. Experience shows that this is in general the case in the stripping of negative photoresists. In the case of negative photoresists, which are predominantly based on cyclized rubber materials and light-sensitive bisazido compounds, a post-rinse with water after the stripping process is consequently possible.

The circumstances prove to be more difficult in the case of positive photoresist materials. Materials of this type are usually based on formaldehyde-phenol condensates of the novolak resin type and light-sensitive quinonediazidesulphonyl derivatives. The photoresists usually require a heat-treatment in the preparation of the resist coating and after the photopatterning to increase the adhesion to the substrate. In this process the temperatures are between 100° and 200° C., usually between 140° and 180° C. In this connection the improvement in the properties is decisively dependent on the applied temperature. In the subsequent plasma etching or ion implantation processes the coatings are also exposed to fairly high temperatures. Positive resists of this type cannot be completely removed from the substrate without difficulty by the stripper solution, in particular if treated at high temperature. When freshly stripped wafers are immersed in water, unremoved laquer residues form, together with precipitating stripper components and stripped photoresist components, an essentially insoluble covering on the semiconductor surface. This covering can only be removed with difficulty or not at all even with running water and under pressure so that completely clean surfaces are only obtainable by including an intermediate bath containing organic solvents beforehand.

SUMMARY OF THE INVENTION

It is therefore an object to provide a method and an agent with which satisfactorily clean semiconductor surfaces can be obtained after the removal of photoresist layers, in particular in the case of positive photoresists, quickly but without recourse to additional organic intermediate baths.

Upon further study of the specification and appended claims, further objects and advantages of this invention will become apparent to those skilled in the art.

It has now been found that, surprisingly, these objects can be achieved if the semiconductor substrate is treated after the stripping process with an aqueous post-rinsing agent which contains a nonionogenic surfactant and an organic base.

The subject of the invention is consequently an aqueous post-rinsing agent for the removal of photoresist and stripper residues from semiconductor substrates which contains a nonionogenic surfactant and an organic base in aqueous solution.

The subject of the invention is moreover a method for the removal of photoresist and stripper residues from semiconductor substrates, in which the latter are treated with the post-rinsing agent according to the invention.

DETAILED DISCUSSION

For the post-rinsing agent according to the invention in principle all the known and common nonionogenic surfactants are suitable. Nonionogenic (i.e., non-ionic) surfactants of the group of the ethoxylated alkylphenols, the fatty acid ethoxylates, the fatty alcohol ethoxylates and also the ethylene oxide/propylene oxide condensates have proved particularly beneficial.

Surfactants of this type are industrial products which are available in any desired composition as discrete individual compounds, as mixtures and fraction blends.

Preferred for the field of application according to the invention are commercial ethoxylation products of alkylphenols having 6 to 14 C atoms in the alkyl chain and a degree of ethoxylation of 2 to 20, fatty acids or fatty alcohol ethoxylates with saturated and unsaturated hydrocarbon chains having 8 to 24 C atoms and a degree of ethoxylation also of 2 to 20, and also ethylene oxide/propylene oxide condensates which are made up of about 10–20 monomer units. Particularly preferred are an ethoxylated nonylphenol with an average degree of ethoxylation of 9 and also ethoxylates which are derived from coconut, oleyl, stearyl or tallow fatty acid or fatty alcohol and have a degree of ethoxylation of 8 to 12. Products blends containing such surfactants as main components or mixtures of various of these surfactants may also be used.

As the second essential component the post-rinsing agent according to the invention contains an organic base. In principle all the simple organic bases are suitable which are sufficiently water soluble and rapidly form readily water-soluble salts with alkylbenzenesulphonic acids. This requirement is fullfilled by aliphatic means having 1 to 12 C-Atoms in total. Optionally the aliphatic groups of such amines contain substituents such as hydroxy rendering the base more water soluble.

In any event the minimum water solubility of the base should be about 1% by weight and preferably the water solubility should be so to be included in the agent of the invention to the extent of 1 to 10% by weight. Bases from the ethanolamine, diethanolamine and triethanolamine group have proved well suited for this purpose, triethanolamine being mentioned as particularly suitable.

The content of the agent in terms of surfactant and organic base and also the quantitative ratio of these two components to each other is largely uncritical. Contents of 0.1 to 10% by weight of surfactants and 1 to 10% by weight of triethanolamine referred to the total quantity of the ready-to-use rinsing agent have proved beneficial for the field of application according to the invention. Particularly preferred is an aqueous solution which contains 1–5% by weight of ethoxylated alkylphenol and about 5% by weight of triethanolamine.

The preparation of the post-rinsing agent according to the invention is carried out in a simple manner by dissolution or mixing of the two components with deionized water, optionally with slight heating. After any fine filtration necessary to guarantee the freedom from particles necessary in semiconductor electronics, the post-rinsing agent is ready for use.

The method according to the invention for the removal of photoresist and stripper residues from semiconductor substrates after the stripping process is carried out in a manner known per se, the post-rinsing agent according to the invention being used instead of water.

After coating the semiconductor discs with a photoresist, exposure, development and stripping in the usual manner, the discs are immersed, directly after being taken out of the stripper bath, in a bath of the post-rinsing agent according to the invention, preferably with slight movement. Normally the post-rinsing process is carried out at room temperature. The post-rinsing agent may, if expedient, also be slightly heated, for example to temperatures around 50° C.

In this process it turns out that the post-rinsing process requires noticeably shorter times with the agent according to the invention in the case of stripped negative photoresist coatings to obtain satisfactorily clean wafer surfaces than in the case of post-rinsing with water only. Post-rinsing times of 0.5 to 1 minute are adequate compared with normally 1 to 2 minutes with water.

Particularly surprising is the result in the case of stripped positive photoresist coatings. Even in the case of positive resists which had been post-treated at temperatures of up to 180° C. satisfactorily clean wafer surfaces can be obtained after the stripping, which particularly in the case of high-temperature treated material is usually incomplete, within 1 to 5 minutes by post-rinsing with the agent according to the invention. This was not possible in such a simple and problem-free manner by the methods previously used.

After removal of the semiconductor materials from the post-rinsing agent, rinsing off is carried out for a further short period with deionized water; after completely drying the semiconductor substrates they can now be passed on immediately to the further usual treatment processes.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the preceding text and the following examples, all temperatures are set forth uncorrected in degrees Celsius and all parts and percentages are by weight, unless otherwise indicated.

EXAMPLES

1. A post-rinsing agent is prepared from 50 g of ethoxylated nonylphenol (average degree of ethoxylation about 9)
50 g of triethanolamine and
900 ml of deionized water.

2. Use

Silicon wafers, thermally oxidized on the surface, are coated in the normal manner with commercial negative photoresist or positive photoresist, exposed and developed. Thereafter they are subjected to a heat-treatment process (post-bake) at temperatures between 140° and 200° C. The stripping is then carried out in a commercial stripper bath, it being possible to carrying out the treatment with various times and temperatures or several times. After removal from the stripper bath, the wafers are treated with the rinsing agent according to Example 1 or for comparison with running water.

The detailed process conditions and also the results are reproduced in Table 1 below.

TABLE 1

| Type of photo-resist | heat-treatment (post-bake) time/temp. | Stripping Time/temperature Bath 1 | Stripping Time/temperature Bath 2 | Post-rinsing Running water | Immersion in agent according to invention |
| --- | --- | --- | --- | --- | --- |
| | | | | Post-rinsing time | |
| | | | | 1–2' | 0.5–1' |
| Negative | 30'/140° C. | 5'/100° C. | 5'/100° C. | + | + |
| | 30'/170° C. | 5'/100° C. | 5'/100° C. | + | + |
| | | | | >5' | 1–5' |
| Positive | 30'/140° C. | 5'/100° C. | 5'/100° C. | − | + |
| | 30'/160° C. | 5'/130° C. | 5'/130° C. | − | + |
| | 30'/180° C. | 10'/130° C. | 5'/130° C. | − | + |
| | 30'/200° C. | 50'/130° C. | ./. | − | − |

+: Good result; satisfactorily clean surface
−: Unusable result; contamination on the surfaces It turns out that in the case of negative resists clean wafer surfaces can be obtained by rinsing under running deionized water, but markedly more rapidly with the agent according to the invention.

In the case of positive resists, in particular if they have been aged between 140° and 180°, satisfactorily clean wafers are only obtained if they are treated with the post-rinsing agent according to the invention immediately after stripping.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A method for removing photoresist and stripper residues from a substrate comprising treating with a post rinsing agent a substrate which has been subjected to photoresist stripping with a photoresist stripping agent and removed from said photoresist stripping agent, said post-rinsing agent comprising effective amounts of a nonionic surfactant and an organic base in aqueous solution, said organic base being water soluble to a degree whereby it will form a water-soluble salt with alkylbenzenesulfonic acids when the agent is contacted therewith.

2. A method of claim 1, for removing photoresist and stripper residues from a substrate, comprising treating the substrate with a post-rinsing agent consisting essentially of said nonionic surfactant, organic base and water.

3. A method of claim 2, wherein the photoresist residue is a positive photoresist.

4. A method of claim 3, wherein the substrate is a semiconductor.

5. A method of claim 1, for removing photoresist and stripper residues from a substrate, comprising treating the substrate with a post-rinsing agent wherein the organic base is ethanolamine, diethanolamine or triethanolamine.

6. A method of claim 5, wherein the photoresist residue is a positive photoresist.

7. A method of completely removing photoresist structures and residues from a substrate which has been subjected to photoresist imaging, comprising treating the substrate with a photoresist stripper, removing the substrate from the stripper, and treating the substrate with a post-rinsing agent comprising effective amounts of a nonionic surfactant and an organic base in aqueous solution, said organic base being water soluble to a degree whereby it will form a water soluble salt with alkylbenzenesulfonic acids when the agent is contacted therewith.

8. A combination of (a) a substrate which has been subjected to photoresist stripping with a photoresist stripping agent and removed from said photoresist stripping agent and has resultant photoresist or stripper residue thereon, and (b) an aqueous post rinsing agent in contact with said substrate, comprising effective amounts of a nonionic surfactant and an organic base in aqueous solution, said organic base being water soluble to a degree whereby it will form a water-soluble salt with alkylbenzenesulfonic acids when the agent is contacted therewith.

9. A combination of claim 8 wherein said post-rinsing agent consists essentially of said nonionic surfactant, organic base and water.

10. A combination of claim 8, wherein the surfactant is an ethoxylated alkylphenol, a fatty acid ethoxylate, a fatty alcohol ethoxylate or an ethylene oxide/propylene oxide condensate.

11. A combination of claim 8, wherein the organic base is ethanolamine, diethanolamine or triethanolamine.

12. A combination of claim 10, wherein the organic base is ethanolamine, diethanolamine or triethanolamine.

13. A combination of claim 8, wherein the amount of surfactant is 0.1–10% by weight, and the amount of organic base is 1–10% by weight, referred to the total quantity.

14. A combination of claim 12, wherein the amount of surfactant is 0.1–10% by weight, and the amount of organic base is 1–10% by weight, referred to the total quantity.

15. A combination of claim 8, wherein the amount of surfactant is 1–5% by weight, and the amount of organic base is about 5% by weight, referred to the total quantity.

16. A combination of claim 12, wherein the amount of surfactant is 1–5% by weight, and the amount of organic base is about 5% by weight, referred to the total quantity.

17. A combination of claim 8, wherein the photoresist is a positive photoresist.

18. A combination of claim 17, wherein the substrate is a semiconductor.

* * * * *